United States Patent
Minamitani et al.

(10) Patent No.: US 7,296,618 B2
(45) Date of Patent: Nov. 20, 2007

(54) LIQUID COOLING SYSTEM AND ELECTRONIC APPARATUS USING THE SAME

(75) Inventors: Rintaro Minamitani, Tsukuba (JP);
Shinji Matsushita, Chigasaki (JP);
Shigeo Ohashi, Tsuchiura (JP);
Yoshihiro Kondo, Tsuchiura (JP);
Takashi Naganawa, Chiyoda (JP);
Osamu Suzuki, Chiyoda (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/791,823

(22) Filed: Mar. 4, 2004

(65) Prior Publication Data

US 2005/0047091 A1    Mar. 3, 2005

(30) Foreign Application Priority Data

Aug. 25, 2003    (JP)    ............................... 2003-299430

(51) Int. Cl.
*F28F 7/00* (2006.01)
*F28D 15/00* (2006.01)
*H05K 7/20* (2006.01)

(52) U.S. Cl. ............................... 165/80.4; 165/104.33; 361/699

(58) Field of Classification Search ............... 165/80.4, 165/104.33, 80.5, 108; 361/698, 699, 687; 257/714

See application file for complete search history.

(56) References Cited

U.S. PATENT DOCUMENTS

| | | | | |
|---|---|---|---|---|
| 2,917,685 A | * | 12/1959 | Wiegand | 257/714 |
| 3,965,000 A | * | 6/1976 | Mikule et al. | 210/661 |
| 4,865,123 A | * | 9/1989 | Kawashima et al. | 165/104.33 |
| 5,309,319 A | * | 5/1994 | Messina | 361/699 |
| 5,406,807 A | * | 4/1995 | Ashiwake et al. | 62/376 |
| 5,572,538 A | * | 11/1996 | Saitoh et al. | 372/34 |
| 6,510,052 B2 | * | 1/2003 | Ishikawa et al. | 361/687 |

* cited by examiner

*Primary Examiner*—Tho Duong
(74) *Attorney, Agent, or Firm*—Antonelli, Terry, Stout & Kraus, LLP.

(57) ABSTRACT

A liquid cooling system is disclosed for use in an electronic apparatus. The system is constructed to be of a reduced size and thickness, thus allowing it to be used for cooling heat-generating devices such as semiconductor elements, while maintaining corrosion resistance. The system includes a pump, a heat-receiving jacket, and flow passages through which the cooling liquid is circulated. An ion exchange bag having a water-permeable bag is disposed within the liquid cooling system. The water-permeable bag further contains an ion exchange resin therein.

8 Claims, 9 Drawing Sheets

LIQUID COOLING SYSTEM AND ELECTRONIC APPARATUS USING THE SAME

BACKGROUND OF THE INVENTION

The present invention relates to an electronic apparatus for cooling a semiconductor element therein, with using a liquid cooling system.

The semiconductor element generates heat during the operation thereof, which is used in an electronic apparatus, such as a computer, etc.

In particular, with the semiconductor in recent year, the heat-generation comes up much more, due to the demands on high processing speed and high capacity or performances thereof. In general, the semiconductor element looses the function of as the semiconductor element, remarkably, when exceeding over a predetermined level in temperature thereof, and therefore it is necessary to make compulsive cooling, in particular, on the semiconductor having a large amount of heat generation thereof.

As a method for cooling down the semiconductor of the electronic apparatus, for example, there are already known methods of applying the heat conduction, applying an air cooling, with using a heat pipe, and applying a liquid cooling, etc.

Among of those, cooling applying a liquid cooling is most effective for the semiconductor element having large heat-generation.

Such the cooling method applying the liquid cooling is described, in more details thereof, for example, Japanese Patent Laying-Open Nos. Hei 5-335454 (1993), Hei 6-97338 (1994), Hei 6-125188 (1994), Hei 10-213370 (1998), etc.

However, those conventional technologies are limited in the use thereof only in a filed of a large-scaled computer.

This is because the liquid cooling system comes to be large in the scale due to the fact that it needs a large number of parts for exclusive use of cooling, such as a pump, a piping system, a radiator, etc., and it is difficult to maintain the reliability in respect of applying the liquid into cooling thereof.

Also, another one reason thereof is the fact that such the semiconductor element is not used in the field other than the large-scaled computer, which has a large heat-generation so that the liquid cooling is needed therein.

Technology of applying the liquid cooling into a small-sized electronic apparatus is disclosed in Japanese Patent Laying-Open No. Hei 6-266474 (1994). In this prior art, a heat-receiving jacket attached on the semiconductor element and a radiator disposed apart from it are connected through flexible tubes, thereby cooling down it with an aid of the liquid flowing therein.

However, as was mentioned previously, an amount of heat-generation comes up every year, in particular, of the semiconductor elements, etc., which are used in the electronic apparatuses, such as, a personal computer, a home server, a projector, a media storage, etc., and for treating with it, but a compulsive cooling is not sufficient enough, with using the natural air cooling or a fan, or a cooling of using the heat pipe therein.

Then, attention was paid onto the technology described in Japanese Patent Laying-open No. Hei 6-6266474 (1994), and with this, it is possible to receive the liquid cooling system within an inside of a case of a personal computer, by using the case itself of the computer to be a heat radiation plate, which is made of a metal material having good heat conductivity.

However, installation of the liquid cooling system into such the computer causes a new problem.

That is, due to the fact that only a small amount of the liquid is held within the liquid cooling system, and further that the operating temperature thereof is relatively high, etc., corrosion is promoted on the parts or elements in contact with the liquid, which are made of a metal material, such as, the heat-receiving jacket and the radiator, since the liquid is degraded in quality thereof even if the corrosive ion flow out in a very small amount thereof, in particular, from the parts or element of an organic material (i.e., the parts or element made of synthetic resin).

If causing water leakage due to the corrosion, it results into an important problem of stopping the function of that electronic apparatus; therefore, it is indispensable to make a treatment of measure of anti-corrosion on the parts or element, to be in contact with the cooling water.

Further, a treatment of measure of anti-corrosion due to a liquid is already known, for example, in Japanese Patent Laying-Open No. 2003-185321 (2003).

BRIEF SUMMARY OF THE INVENTION

An object, according to the present invention, is to provide a liquid cooling system enabling to maintain corrosion resistance for a long time period (for example, from 5 to 10 years), and also an electronic apparatus using the same therein.

According to the present invention, the object mentioned above is accomplished by a liquid cooling system, comprising: a pump for supplying a cooling liquid; a heat-receiving jacket, being supplied with said cooling liquid, for receiving heat from an electronic parts; a radiator, being supplied with said cooling liquid passing through said heat-receiving jacket, for radiation heat therefrom; and flow passages for circulating said cooling liquid in a route passing through said radiator back to said pump, wherein: an ion exchange bag, having a bag enclosing an ion exchange resin therein, is disposed in a part of said route.

Also, according to the present invention, the object mentioned above is accomplished with the liquid cooling system, as mentioned above, wherein: the ion exchange bag, having the bag enclosing the ion exchange resin therein, is held within a container, and said ion exchange holder being exchangeable with the ion exchange bag is provided in said container.

And also, according to the present invention, the object mentioned above is accomplished with the liquid cooling system, as mentioned above, wherein: said ion exchange bag or said ion exchange holder are disposed within an inside or a downstream of said radiator, and also in one of parts building up the liquid cooling system in an upstream of said heat-receiving jacket.

Further, according to the present invention, the object mentioned above is accomplished with an electronic apparatus, comprising: a heat-generation element mounted on a substrate; a heat-receiving jacket, being thermally connected to said heat-generation element; a heat radiation jacket for radiating heat of a heated liquid supplied from said heat-receiving jacket; a pump for circulating the liquid to those jackets; and a piping for connecting said pump and said both jackets, wherein: an ion exchange bag, having a bag enclosing ion exchange resin therein, is provided on way of said piping.

BRIEF DESCRIPTION OF THE SEVERAL VIEWS OF THE DRAWING

Those and other objects, features and advantages of the present invention will become more readily apparent from the following detailed description when taken in conjunction with the accompanying drawings wherein.

DETAILED DESCRIPTION OF THE INVENTION

Figure 1:
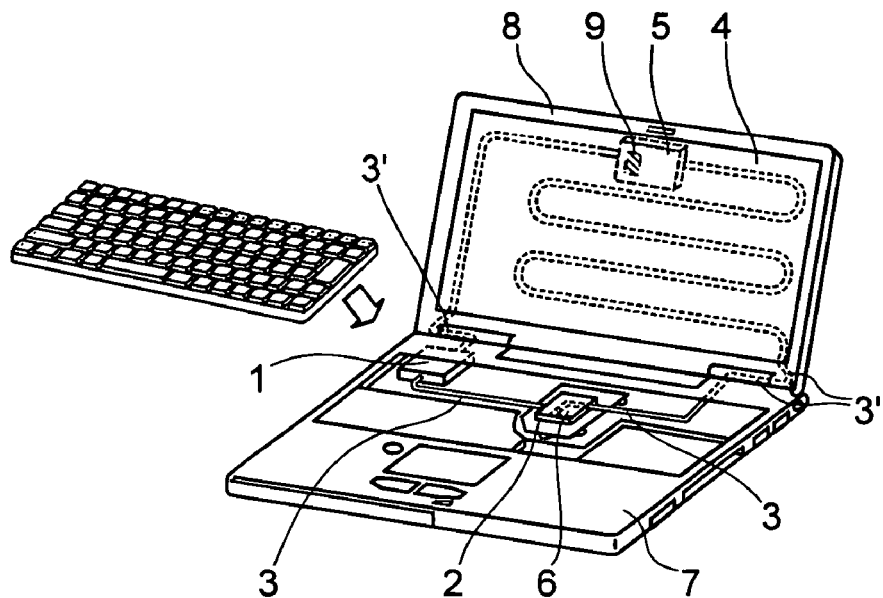
FIG. 1 is a perspective view of a personal computer of notebook type, applying a cooling system therein, according to the present invention.

Hereinafter, explanation will be made on the embodiments according to the present invention, by referring to the drawings attached herewith.

FIG. 1 is a perspective view of a personal computer of notebook type, with using the cooling system according to the present invention therein.

However, though will be explained about upon the notebook type personal computer most familiar with, hereinafter, however the present should not be restricted only to such the notebook type personal computer, but is also applicable to other electronic apparatuses, reaching up to so-called a desktop type personal computer and a server.

In FIG. 1, a semiconductor element 6 installed within a main housing 7 is connected with a heat-receiving jacket 2, within an inside of which is formed a flow passage for a cooling liquid. In the main housing 7 is also provided a pump 5. On a rear surface of a housing 8 of a display device, there are provided a heat radiation pipe 4 and a tank 5. The pump 1, the heat-receiving jacket 2, the heat radiation pipe 4 and the tank 5 are connected to builds up a closed-loop through connector pipes 3, as shown in the figure, and within an inside of those is filled up with a cooling liquid 10 (will be described by referring to FIG. 2). Within the tank 5 is provided an ion exchange bag 9. Between the main housing 7 and the display device housing 8, the piping is connected by using flexible tubes 3'.

Figure 2:
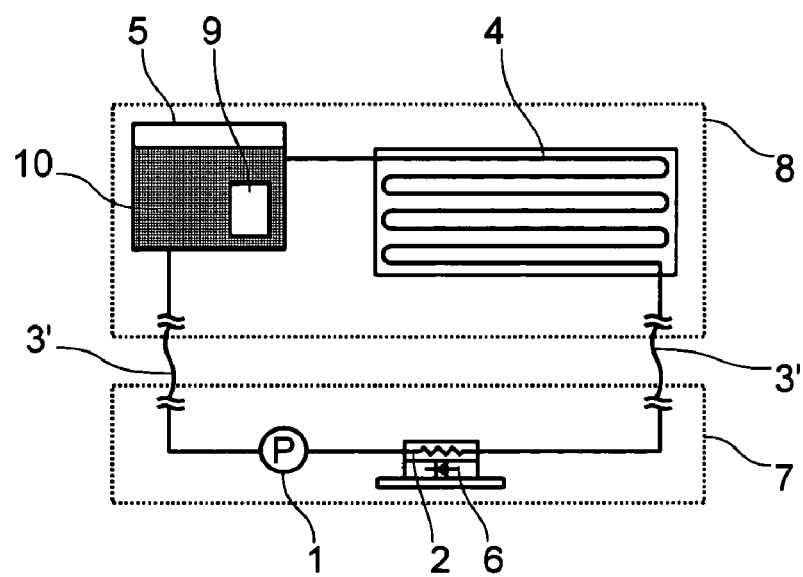
FIG. 2 is a block diagram of the personal computer of notebook type, applying the cooling system therein, also according to the present invention.

FIG. 2 is a view for showing the liquid cooling system of the notebook type personal computer, which is shown in FIG. 1 mentioned above, according to the first embodiment, but in the form of a block diagram thereof.

In this FIG. 2, the ion exchange bag 9 is made from a bag having water permeability, and being formed rod-like in the shape thereof and containing the ion exchange resin therein. For the purpose of suppressing thermal degradation of the ion exchange resin, it is preferable to dispose the ion exchange bag within an inside of the radiator, being low in temperature thereof, or in the downstream thereof, and also within the constituent parts of the liquid cooling system in the upstream of the heat-receiving jacket.

The conventional ion exchanger is built up with filling the ion exchange resin into a cylindrical container, so that the cooling water passes through this ion exchange resin, to be treated with the ion exchange with high efficiency thereof, thereby improving the liquid quality of the cooling liquid. This structure is applied into the liquid cooling system for the large-scaled computer, for example. In a small-sized computer, because of application of a small-sized motor therein, it is impossible to use an ion exchanger of such the water-conducting type having a large pressure loss therein.

According to the present invention, a dipping type ion exchange bag 9 is applied therein, wherein ions within the cooling liquid are adsorbed due to diffusion. The corrosive ions flow out from the organic materials used within, such as, the pump 1, the tank 5, the flexible tubes 3', etc.

Figure 3:
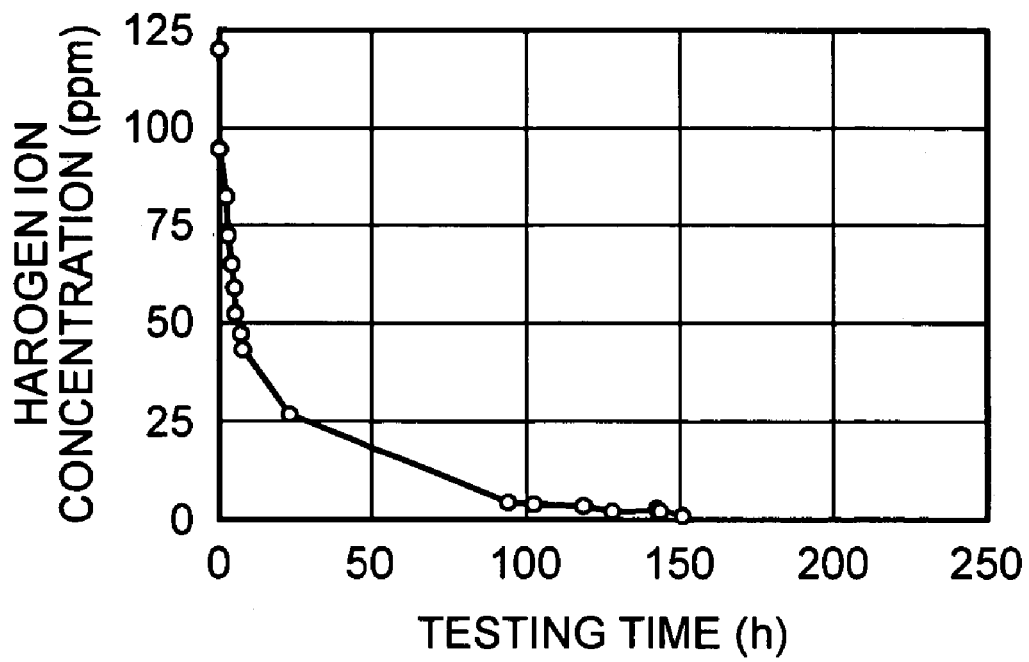
FIG. 3 is a graph for showing change in a halogen ion concentration with the passage of time, with using an ion exchange bag therein.

FIG. 3 is a graph for showing change in a halogen ion concentration with using ion exchange bag in the small-sized liquid cooling system, with respect to the passage of time.

In this FIG. 3, 1 cc of the ion exchange bag tested can adsorb all 300 ppm of chlorine ion within 50 cc of the cooling liquid during a time period of 100 hours. With this system, an amount of chlorine ions flowing out for five (5) years is equal to 300 ppm or less than that.

From this, it is apparent that adsorption velocity due to diffusion of the ion exchange resin within the ion exchange bag is sufficiently swift with respect to the flow-out velocity of the ions. Accordingly, the dipping-type ion exchange bag can be an effective means for corrosion control in the small-sided liquid cooling system.

EXAMPLE 1

Figure 4:
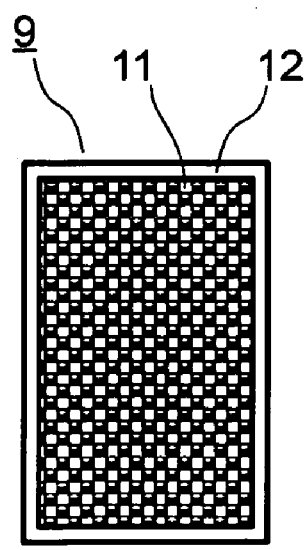
FIG. 4 is a view for showing an example of the ion exchange bag, according to the present invention.

FIG. 4 is a view for showing an example of the ion exchange bag 9 mentioned above therein.

In this FIG. 4, the ion exchange bag is made up with an ion exchange resin 11, mixing up a positive ion (i.e., a cation) exchange rein for adsorbing the positive ions and a negative (i.e., an anion) ion exchange resin for adsorbing the negative ions, and a water-permeable bag 12, which contains the ion exchange resins therein and is formed to be rod-like in the shape thereof.

In other words, like a teabag of green tea or black tea enclosing the tea leaves by the water-permeable cloth or paper, it also encloses the ion exchange resins by the water-permeable cloth or paper, and it is bonded on the periphery thereof, or welded through heating (in FIG. 4, being indicted by a white outlined portion surrounding the ion exchange resin 11).

This ion exchange bag 9 is effective for ion adsorbing within the cooling water, if putting it into the tank, for example, since almost of the cooling liquid circulating around passes through the ion exchange bag 9.

However, the ion exchange bag 9 floats up to the surface within the tank if only put into the tank, therefore it is preferable to fix the ion exchange bag 9 at a predetermined position within an inside of the tank.

However, in a case where the ions flowing out is only the positive one (i.e., the cation), such as, a metal ion or the like, the ion exchange bag may be made up with only the positive ion exchange resin. Also, in a case where the ion flowing out is only the negative ion (i.e., the anion), such as, halogen ion or the like, the ion exchange bag may be made up with only the negative ion exchange resin.

For the small-sized liquid cooling system of being equal or less than 1 litter, it is preferable that the ion exchange bag contains therein the ion exchange resin being equal or less than 10 cc in the volume. The water-permeable bag is sealed up through, such as, the thermo-welding, etc. The water-permeable bag is made from mesh or non-woven fabric, on which treated with a water permeability processing, then it comes into the cooling liquid swiftly; therefore it sinks down, but without remaining a bubble within the bag.

With this, the corrosive ions within the cooling liquid can permeate through the water-permeable bag together with the cooling liquid, thereby being adsorbed by the ion exchange resin within the bag. An amount of the ion exchange resin to be filled up within the bag is determined by paying the consideration upon the expansion of the cooling liquid when it is frozen. Also, sizes of a small cavity of the mesh or the non-woven fabric are determined, so that the cracking ion exchange resin cannot passes therethrough. This cracking ion exchange resin comes to be a reason of causing a trouble within the pump, if it reached to the movable portion thereof, for example.

EXAMPLE 2

Figure 5:
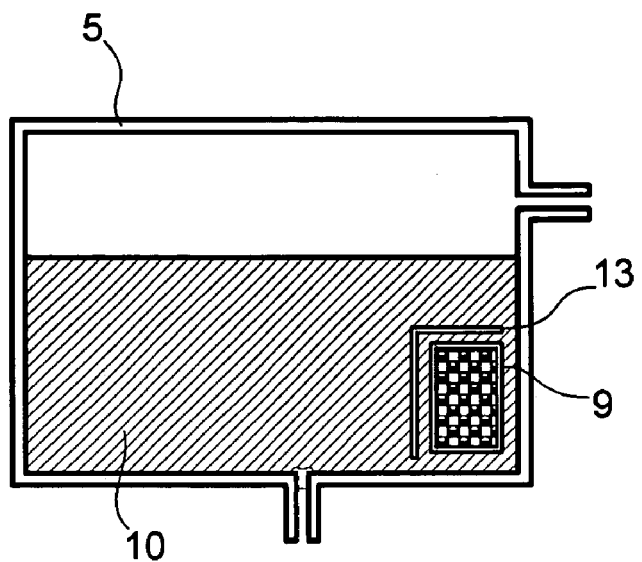
FIG. 5 is a view for showing the structure of a tank, applying the ion exchange bag according to the present invention therein.

FIG. 5 is a view for showing the condition, in a case where the ion exchange bag is located at the predetermined position within the tank.

In this FIG. 5, surrounding the ion exchange bag is provided a partition plate 13.

With this, the ion exchange bag 9 will not comes up to the surface if a gaseous layer remains in an inside thereof, thereby enabling to adsorb the corrosive ions within the cooling liquid. Also, with provision of the partition plate 13 at the central portion of the tank 5, it is possible to hold the ion exchange bag 9 within the cooling liquid if the cooling system is used in any posture thereof. For this reason, the corrosive ions within the cooling liquid can pass through the water-permeable bag together with the cooling liquid, to be adsorbed by the ion exchange resin within the bag.

EXAMPLE 3

Figure 6:
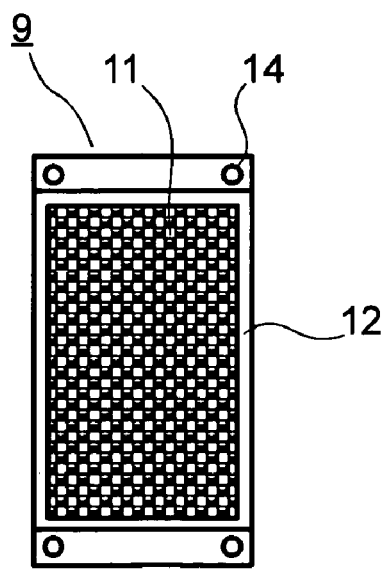
FIG. 6 is a view for showing the ion exchange bag, according to one embodiment of the present invention.

FIG. 6 is a view for showing other embodiment of the ion exchange bag therein.

In this FIG. 6, the water-permeable bag 12, having a hole 14 for use of fixing thereof, can be holed within the liquid, but without floating up when a gaseous layer is formed within the bag because of the low water-permeability thereof. For this reason, the corrosive ions within the cooling liquid can pass through the water-permeable bag together with the cooling liquid, to be adsorbed by the ion exchange resin within the bag.

EXAMPLE 4

Figure 7:
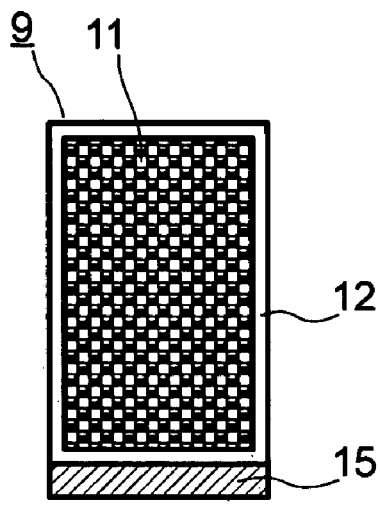
FIG. 7 is a view for showing the ion exchange bag, according to other embodiment of the present invention.

FIG. 7 is a view for showing further other embodiment of the ion exchange bag therein.

In this FIG. 7, the water-permeable bag 12, having a weight 15 for use of prevention of floating, can be held within the liquid, but without floating up even if a gaseous layer is formed therein because of the low water-permeability thereof. In the case of using the anti-floating weight 15 thereon, the ion exchange bag can be held within the liquid when the cooling system is used in any posture thereof. For this reason, the corrosive ions within the cooling liquid can pass through the water-permeable bag together with the cooling liquid, to be adsorbed by the ion exchange resin within the bag. In a case where the tank is made of a metal, such as, iron, the weight 15 can be attached, easily if making it from a permanent magnet.

EXAMPLE 5

Figure 8:
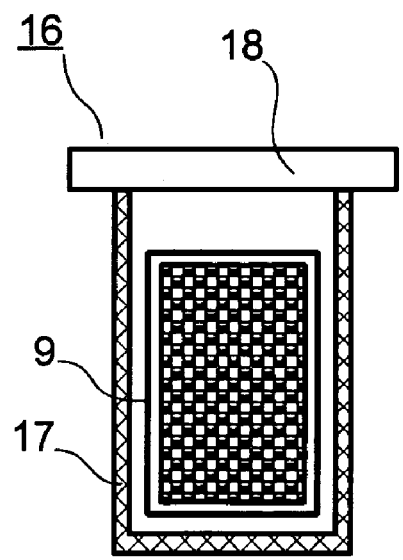
FIG. 8 is a view for showing an ion exchange holder, according to one embodiment of the present invention.

FIG. 8 is a view for showing an example of an ion exchange holder 16 therein.

In this FIG. 8, the ion exchange holder 16 has the ion exchange bag 9, a part for holding that ion exchange bag 9 therein, and a part 18 to be fixed onto a part of cooling parts (such as, the tank). The part for holding the ion exchange bag 9 therein is made of a metal mesh, for example, and the part 18 to be fixed onto the cooling part is a flange, for example.

However, the flange has a function of sealing up therethrough, with using such as, packing or an "O" ring, for example. The ion exchange holder 16 has an advantage that the ion exchange bag can be exchanged, easily, when the capacity of adsorbing the corrosive ions is reduced down due to the degradation of the ion exchange resin. Also, using of the holder in common with, as a water supply opening, brings about an advantage that the water can be supply in addition, easily when the cooling liquid is lowered down in the amount thereof.

Figure 9:
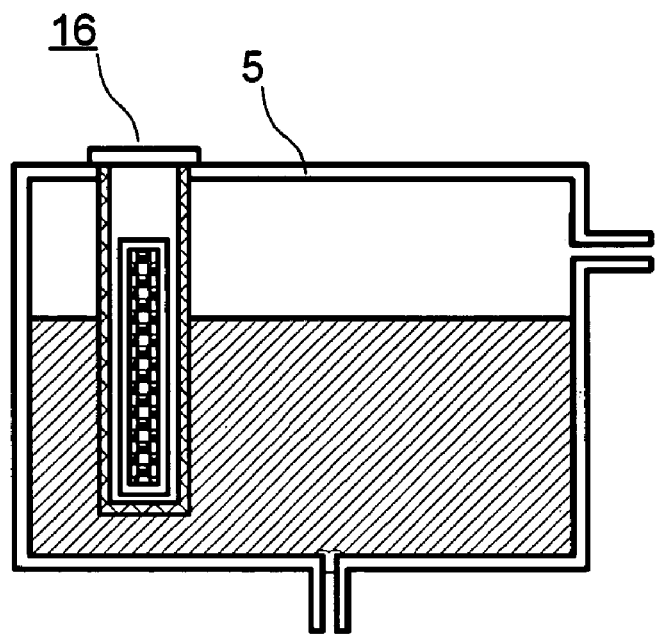
FIG. 9 is a view for showing the structure of a tank, using the ion exchange holder therein, which is shown in FIG. 8 mentioned above.

FIG. 9 is a view for showing an example, in which the ion exchange holder 16 is installed in the tank 5.

In this FIG. 9, further if the ion exchange holder 16 is located in the vicinity of the center of the tank, the ion exchange holder can be held within the cooling liquid if the cooling system is used in any posture thereof. For this reason, the corrosive ions within the cooling liquid can pass through the water-permeable bag together with the cooling water, thereby being adsorbed by the ion exchange resin within the bag.

EXAMPLE 6

Figure 10:
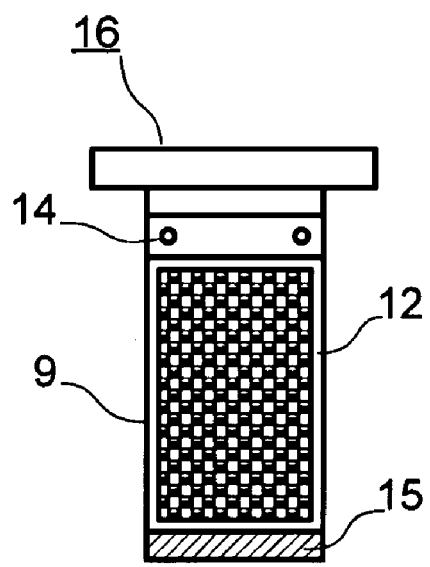
FIG. 10 is a view for showing the ion exchange holder, according to other embodiment of the present invention.

FIG. 10 is a view for showing other embodiment of the ion exchange holder 16 therein.

In this FIG. 10, the water-permeable bag 12 attached with the anti-floating weight 15 is fixed on a fixing part 18, such as, the flange, etc., with using the fixing hole 14. The ion exchange bag 14 is soft, therefore the ion exchange bag can be held within the cooling liquid even if the cooling system is used in any posture thereof. For this reason, the corrosive ions within the cooling liquid can pass through the water-permeable bag together with the cooling liquid, to be adsorbed by the ion exchange resin within the bag.

EXAMPLE 7

Figure 11:
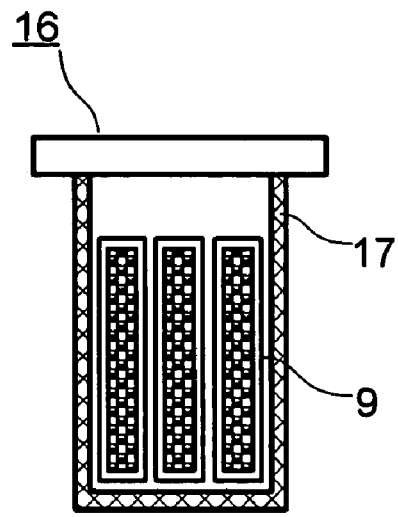

FIG. 11 is a view for showing other embodiment of the ion exchange holder 16, therein.

In this FIG. 11, with using a plural pieces of ion exchange bags, each being thin in the shape thereof, the contacting area between the ion exchange resin and the cooling liquid can be increased up; therefore it is possible to adsorb the corrosive ions in an earlier stage. In a case there is a necessity of adsorbing the corrosive ions in the earlier stage in this manner, it is effective to adopt the structure of increasing up the contacting area between the ion exchange resin and the cooling water, with using the ion exchange bags in the plural number thereof, and/or a below-like ion exchange bag, for example.

EXAMPLE 8

Figure 12:
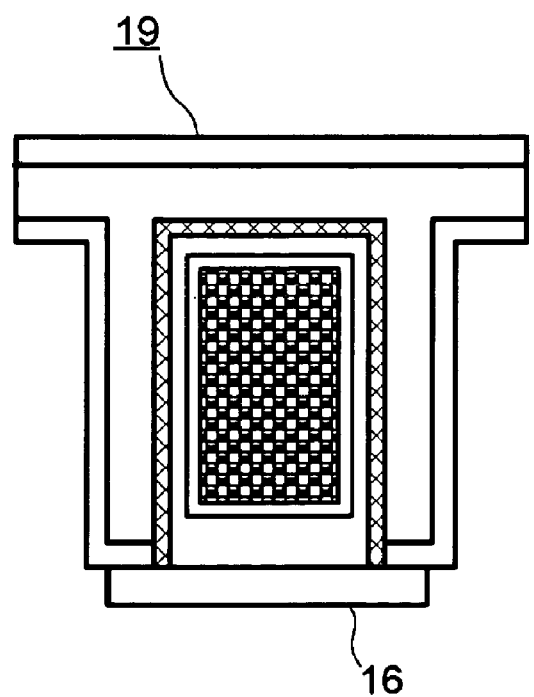
FIG. 12 is a view for showing the structure of pipe arrangement with using therein the ion exchange bag, according to one embodiment of the present invention.

FIG. 12 is a view for showing an embodiment, in which the ion exchange holder 16 is inserted into a container having a connect opening thereof.

In this FIG. 12, the ion exchange holder 15 is attached onto the container 19 having the connect opening between the conduit 3. The ion exchange holder 16 does not block the flow passage of the cooling liquid, therefore there is caused no such the pressure loss within the ion exchange holder 16. The ion exchange holder 16 can be replaced with the ion exchange bag 9, easily, when the capacity of adsorbing the ions falls down due to the degradation of the ion exchange resin.

EXAMPLE 9

Figure 13:
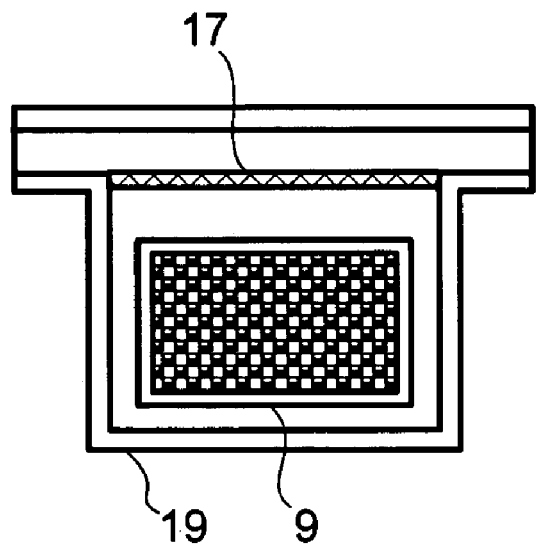
FIG. 13 is also a view for showing the structure of pipe arrangement with using the ion exchange bag therein, according to one embodiment of the present invention.

FIG. 13 is a view for showing an embodiment, in which the ion exchange holder 16 and the container having the connect opening with the conduit are formed into a one body.

In this FIG. 13, if it is not necessary to replace the ion exchange bag 9, the ion exchange holder 16 and the container having the connect opening with the conduit may be formed into a one body, as is shown in the present embodiment. Those ion exchange holders 16 show a large effect, in particular, when they are positioned in an upstream of the heat-receiving jacket, for example, being made of the material in need of corrosion control thereof, since it can adsorb those ions, easily.

EXAMPLE 10

Figure 14:
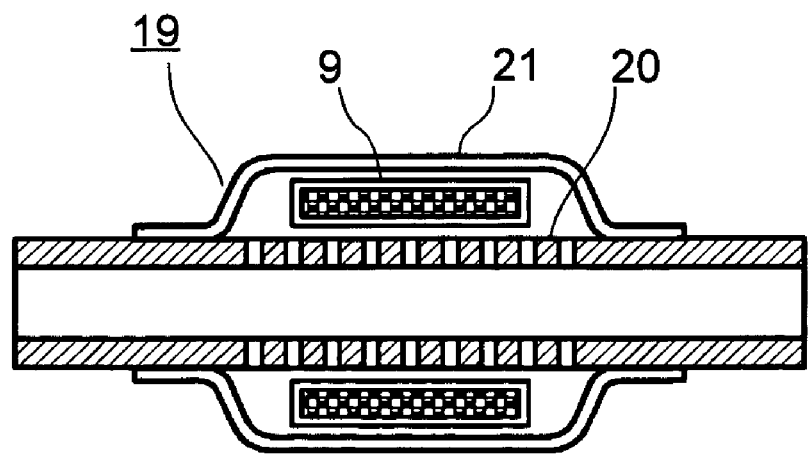
FIG. 14 is also a view for showing the structure of pipe arrangement with using the ion exchange bag therein, according to one embodiment of the present invention.

FIG. 14 shows an example of building up the container 19 with using a conduit 20 having a small capillary in a part thereof and also a cover 21. This container can be manufacture through the drawing process, easily, thereby obtaining a low cost thereof.

EXAMPLE 11

Figure 15:
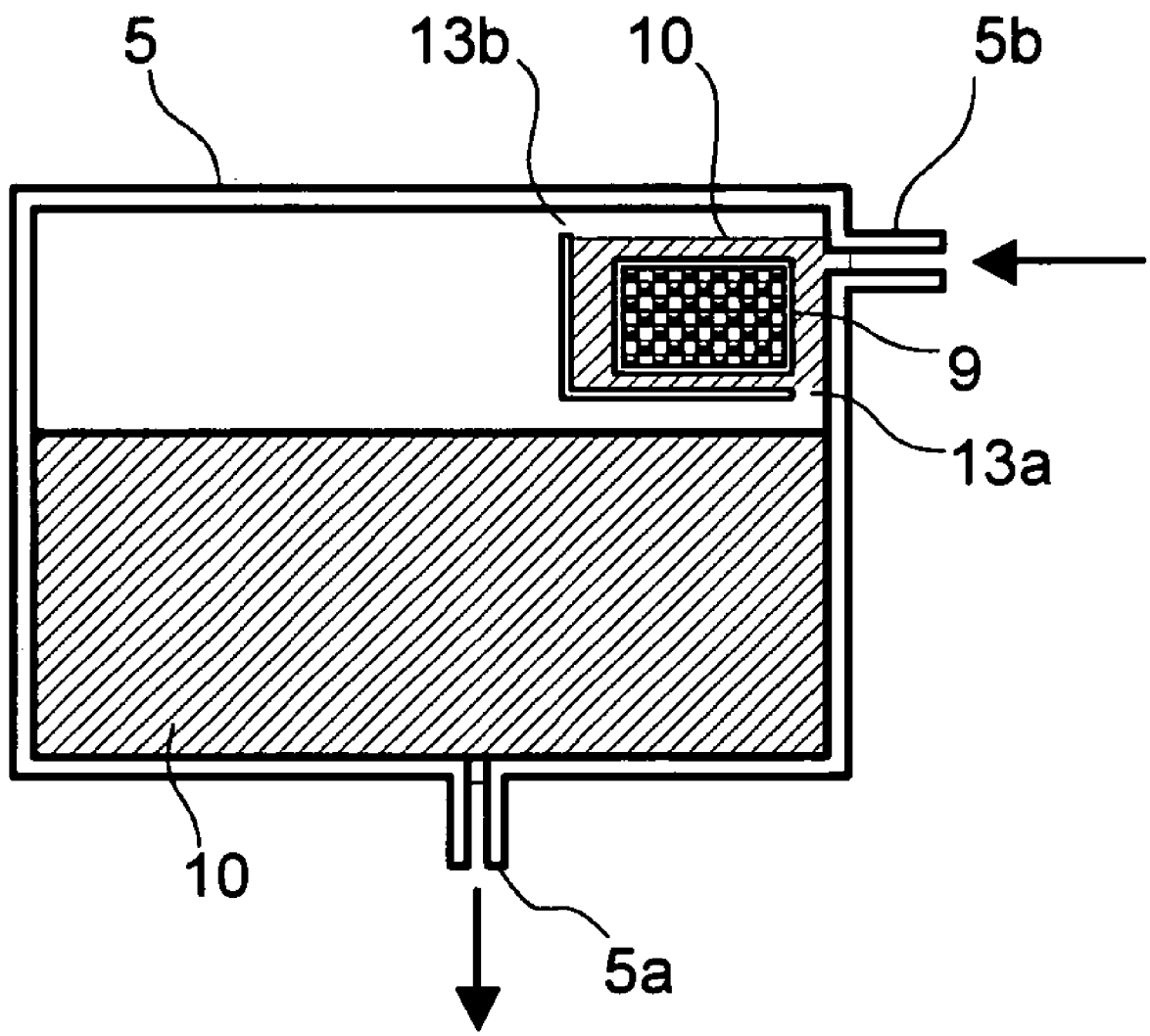
FIG. 15 is a view for showing the structure of a tank using the ion exchange bag or the ion exchange holder therein, according to one embodiment of the present invention.

FIG. 15 is a view for showing the ion exchange bag 9 or the ion exchange holder 16, being disposed within the tank.

In this FIG. 15, around the periphery of the ion exchange bag 9 is provided a partition plate 13. The cooling liquid flows into an inside of the tank from a discharge opening 5b, and is stayed or accumulated within the partition plate. The cooling liquid accumulted within the partition plate drips down from a drip opening 13a opened in the partition plate, gradually. Due to the flow of the cooling liquid dripping therefrom, the corrosive ions within the cooling liquid are adsorbed on the ion exchange resin within the ion exchange bag 9 or the ion exchange holder 16, with superior or high efficiency. In a case where a flow rate of circulation is large, the cooling liquid flowing into the tank 5 overflows from an overflow opening 13b formed in the partition plate.

EXAMPLE 12

Figure 16:
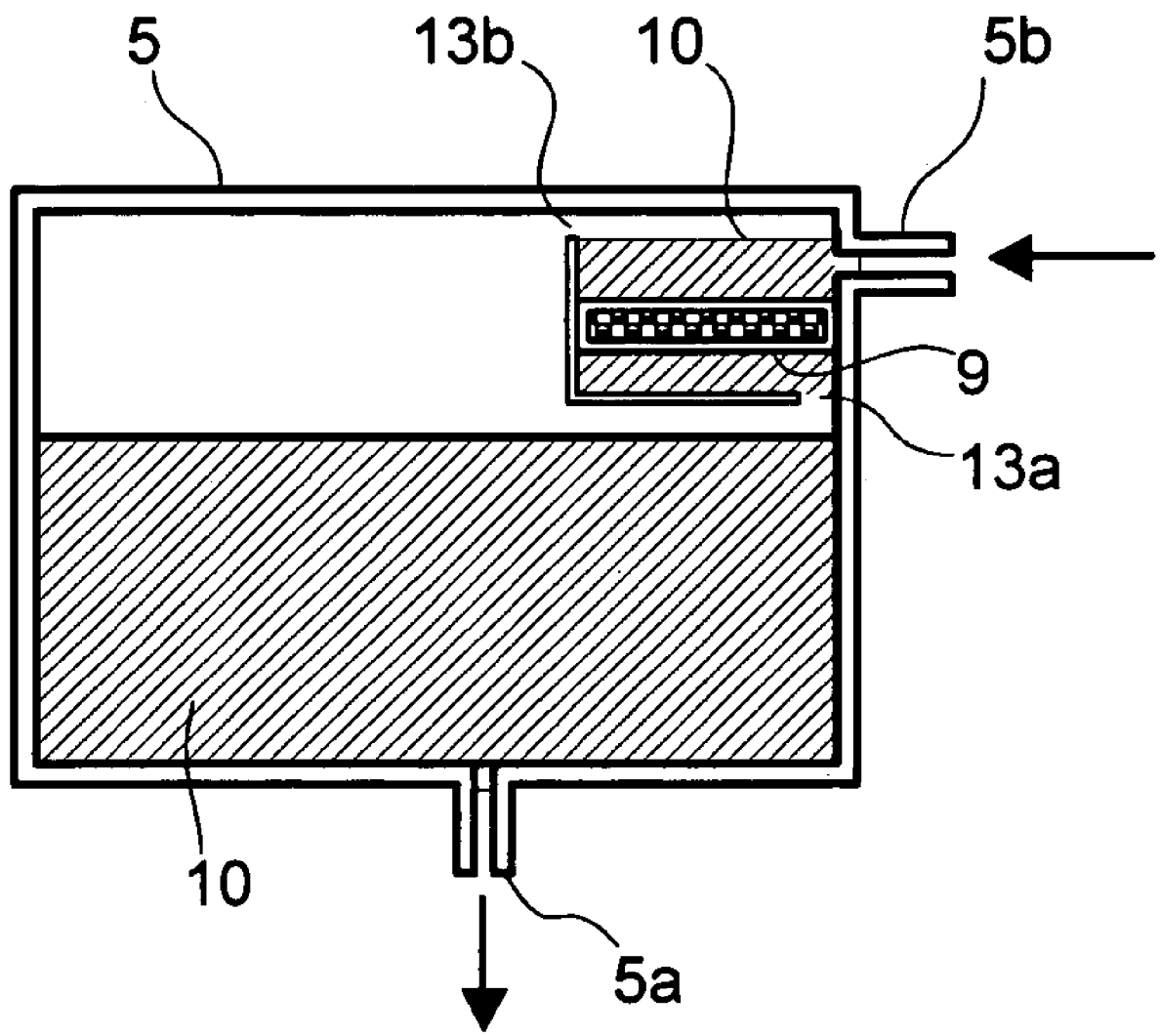
FIG. 16 is a view for showing the structure of a tank using the ion exchange bag or the ion exchange holder therein, according to one embodiment of the present invention.

FIG. 16 shows an example, in which the drip opening 13a of the partition plate and the ion exchange bag 9 or the ion exchange holder 16 are disposed in series.

In this FIG. 16, with this, it is possible to let the cooling liquid to penetrate within the ion exchange bag 9 or the ion exchange holder 16, with using the pump head of the cooling liquid accumulated within the partition plate 13, thereby enabling to adsorb the corrosive ions within the cooling liquid, further effectively. In this so-called a dripping method, the more effective, the higher the pump head of the cooling liquid is.

Thought the embodiments of the ion exchange bag and the ion exchange holder, mentioned in the above, are explained of being applied into only the notebook-type personal computer, in the above, however the present invention can be also applied in the liquid cooling system, being applicable into other electronic apparatuses, such as, the projector, the media storage, and the server, etc., for example.

As was fully explained in the above, according to the present invention, it is possible to provide the liquid cooling system or an electronic apparatus using the same therein, enabling to maintain the corrosion resistance for a long time period (from 5 to 10 years) suitable for the electronic apparatus, which has the heat-generation body therein, such as, the semiconductor element, being microminiaturized and very thin in the thickness and also having a large amount of heat-generation thereof.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraces therein.

What is claimed is:

1. A liquid cooling system for use in art electronic apparatus including a heat-generating element therein, comprising:
   a pump for supplying a cooling liquid;
   a heat-receiving jacket, being supplied with said cooling liquid, for receiving heat from the heat-generating element;
   a radiator, being supplied with said cooling liquid passing through said heat-receiving jacket, for radiating heat therefrom;
   flow passages for circulating said cooling liquid in a route passing through said radiator back to said pump, said flow passages including parts that generate corrosive ions therefrom; and
   a tank for accumulating said cooling liquid circulating within said flow passages, wherein:
   the cooling liquid contained within said system is less than or equal to one liter in volume, an ion exchange bag, having water-permeable surfaces, encloses an ion exchange resin therein, and is disposed in the cooling liquid accumulated within said tank, and said ion exchange bag enables ion exchange through diffusion on almost all water-permeable surfaces thereof.

2. The liquid cooling system, as described in the claim 1, wherein:

the ion exchange bag, having the water-permeable bag enclosing the ion exchange resin therein, is held within a container.

3. The liquid cooling system, as described in the claim 1, wherein:

said ion exchange bag is disposed within an inside or a downstream of said radiator, and also in one of parts building up the liquid cooling system in an upstream of said heat-receiving jacket.

4. The liquid cooling system, as described in the claim 2, wherein:

said ion exchange bag is disposed within an inside or a downstream of said radiator, and also in one of parts building up the liquid cooling system in an upstream of said heat-receiving jacket.

5. The liquid cooling system of claim 1, wherein said ion exchange bag is in the form of an exchange holder.

6. The liquid cooling system of claim 5, wherein said ion exchange holder is held within a container.

7. The liquid cooling system of claim 5, wherein said ion exchange holder is disposed within an inside or a downstream of said radiator, and also in one of parts building up the liquid cooling system in an upstream of said heat-receiving jacket.

8. An electronic apparatus, comprising:

a heat-generation element mounted on a substrate;

a heat-receiving jacket, being thermally connected to said heat-generation element;

a heat radiation jacket for radiating heat of a heated liquid supplied from said heat-receiving jacket;

a pump for circulating the liquid to those jackets; and a piping for connecting said pump and said both jackets, wherein:

the cooling liquid contained within electronic apparatus system is less than or equal to one liter in volume, an ion exchange bag, having a water-permeable bag enclosing ion exchange resin therein, is disposed in said piping, and said ion exchange bag enables ion exchange through diffusion on water-permeable surfaces thereof.

* * * * *